United States Patent [19]
Ordidge

[11] Patent Number: 5,051,698
[45] Date of Patent: Sep. 24, 1991

[54] NMR IMAGING SYSTEMS

[75] Inventor: Roger Ordidge, Nottingham, England

[73] Assignee: National Research Development Corporation, London, England

[21] Appl. No.: 343,205

[22] Filed: Apr. 26, 1989

[30] Foreign Application Priority Data

Apr. 27, 1988 [GB] United Kingdom ................. 8809956

[51] Int. Cl.$^5$ ........................................... G01R 33/20
[52] U.S. Cl. ................................................... 324/309
[58] Field of Search ................ 324/307, 309, 311, 312

[56] References Cited

U.S. PATENT DOCUMENTS

| | | |
|---|---|---|
| 4,297,637 | 10/1981 | Crooks et al. |
| 4,535,290 | 8/1985 | Post et al. |
| 4,599,565 | 7/1986 | Hoenninger, III et al. ........ 324/309 |
| 4,683,432 | 7/1987 | Young |
| 4,689,567 | 8/1987 | Maudsley |
| 4,728,893 | 3/1988 | Feinberg |
| 4,733,185 | 3/1988 | Bottomley ........................ 324/309 |
| 4,855,679 | 8/1989 | Granot ............................. 324/309 |

FOREIGN PATENT DOCUMENTS

| | | |
|---|---|---|
| 0088970 | 9/1983 | European Pat. Off. |
| WOA8505693 | 12/1985 | European Pat. Off. |
| 212734 | 8/1986 | European Pat. Off. |
| 0212734 | 3/1987 | European Pat. Off. |
| 0217578 | 4/1987 | European Pat. Off. |

OTHER PUBLICATIONS

S. Muller, "Multifrequency Selective rf Pulses for Multislice MR Imaging", Magnetic Resonance in Medicine, vol. 6, No. 3, Mar. 1988, pp. 364–371.
Ordidge et al., "Image-Selected in Vivo Spectroscopy (ISIS), a New Technology for Spatially Selective NMR Spectroscopy", Journal of Magnetic Resonance 66, 283–4 (1986).
Silver et al., "Highly Selective $\pi/2$ and $\pi$ Pulse Generation", Journal of Magnetic Resonance 59, 347–51 (1984).
Mansfield et al., "Active Magnetic Screening of Coils for Static and Time-Dependent Magnetic Field Generation in NMR Imaging", J. Phys. E: Sci. Instr. 19 (1986).
Cox et al., "Spectral Resolution in Clinical Magnetic Resonance Spectroscopy", Magnetic Resonance in Medicine 5, 186–90 (1987).
Maudsley et al., "Communications: Spatially Resolved High Resolution Spectroscopy by 'Four-Dimensional' NMR", Journal of Magnetic Resonance 51, 147–52 (1983).
Doddrell et al., "Communications: Spatial and Chemical-Shift-Encoded Excitation, Space, a New Technique for Volume-Selected NMR Spectroscopy", Jour. Mag. Res. 68, 367–72.

Primary Examiner—Michael J. Tokar
Attorney, Agent, or Firm—Cushman, Darby & Cushman

[57] ABSTRACT

Enhanced NMR images of a desired portion of an object are obtained by obtaining a plurality of NMR responses of the object each response comprising information from a plurality of smaller volumes within the object and by combining together the plurality of NMR responses by addition or subtraction to obtain enhanced images from the selected smaller volumes.

4 Claims, 5 Drawing Sheets

NMR IMAGING SYSTEMS

The present invention relates to NMR imaging spectroscopy systems and more particularly to the selection of specific small volumes within a body and to the production of NMR spectra in respect of such small volumes.

Several techniques have been used to produce high resolution in-vivo NMR spectra from selected cubes whose position can be related to an MR image of the subject (R. J. Ordidge, A. Connelly and J. A. B. Lohman; J. Magn. Reson. 66, 283 (1986 ISIS Technique) and D. M. Doddrell, W. M. Brooks, J. M. Bulsing, J. Field, M. G. Irving and H. Baddeley; J. Magn. Reson. 68, 376 (1986)). Whilst all these methods have certain disadvantages, the ISIS technique has proved to be the most easy to use, especially when investigating energy metabolism by phosphorous NMR spectroscopy. The main disadvantage of the ISIS method is that cube selection can only be achieved by the cancellation of large amounts of signal originating from volumes of tissue outside the region of interest. The signal to be investigated is sometimes small in comparison, and errors in the cancellation process, which can be caused by spectrometer instability, are sometimes visible in the resulting spectrum. This problem has now been solved by the use of a selective noise pre-pulse (R. J. Ordidge; Magn. Reson. Med. 5, 93 (1987)) which randomises unwanted spin magnetisation prior to the ISIS experiment. The noise pulse is particularly effective since it randomises the longitudinal spin magnetisation and therefore retains one of the principle advantages of the ISIS technique, namely the insensitivity to the applied radio frequency power level.

A different approach to spatial selection uses the technique of chemical shift imaging (A. A. Maudsley, S. K. Hilal, W. H. Perman and H. E. Simon; J. Magn. Reson. 51, 147 (1983)). Recent advances in technology have enabled this method to be applied in-vivo to the determination of the spatial distribution of phosphorus metabolites. The removal of eddy currents following gradient pulses by the use of actively shielded gradient coils (P. Mansfield and B. Chapman; J. Phys. E: Sci. Instrum. 19, 540 (1986)), has resulted in the acquisition of NMR spectra with minimal delay following the radiofrequency (RF) pulse (I. J. Cox, D. J. Bryant, B. D. Ross, I. R. Young, D. G. Gadiam, G. M. Bydder, S. R. Williams, A. L. Busza and T. E. Bates; Magn. Reson. Med. 5, 186 (1987)). The previous disadvantage of this method was the dependence of acquired spectra upon the spin-spin relaxation time. Although this has now been markedly reduced, this dependence can never be completely eliminated, and the short delay prior to data acquisition (approximately two milliseconds) results in the absence of broad resonance lines in the acquired spectrum (linewidths greater than about 500 Hz), and a slight reduction in signal to noise ratio. Since most of the interesting resonances produce narrow linewidths, the former disadvantage usually only causes phase and baseline artefacts in the resulting spectrum. A further disadvantage of this technique is the relatively long experimental time required to complete a chemical shift imaging experiment. This is typically fifteen minutes for a two dimensional spatial resolution of 32×32, and therefore prevents the method being used in time-course studies on a shorter time scale.

The advantage of chemical shift imaging is that once the experiment has been completed, the data contains an NMR spectrum from each of the elements in the two or three dimensional spatial array. Most of this data is not required; however it must be acquired as part of the imaging process.

The object of the present invention is to provide an extension of the ISIS technique which allows the selection of multiple volumes of material, and in which a compromise can be made between experimental duration and the number size and location of the selected cubes.

According to the present invention there is provided a method of generating an NMR spectrum of a desired portion of an object including obtaining M NMR responses of the object, each response comprising information from a plurality of smaller volumes within said object and combining together M NMR responses by addition or subtraction to obtain responses from selected smaller volumes. The said object can be a portion of a larger body.

In a preferred embodiment in the total sequence of M NMR responses each small volume experiences an even number of inversions or double inversions of the spin system.

Embodiments of the present invention will now be described, by way of example with reference to the accompanying drawings in which:

FIG. 1 illustrates the effect of the sequence of four ISIS experiments required to determine the volume elements of a 2×2 image matrix. $I_{ij}$ represents the intensity of the relevant volume element. Hatched elements experience a single inversion of the NMR spins, whilst cross-hatched elements experience two inversions. For example, in experiment B2, one inversion pulse is applied along each axis of the sample, resulting in the lower right hand element experiencing a double inversion of the spin system;

FIG. 2 shows the spatial distribution of spin inversions required to determine the individual elements of a 4×4 image matrix. Hatched elements experience a single inversion, and cross-hatched elements a double inversion. In experiment D4 for example, the two central columns and the two central rows are inverted, giving a double inversion of the four central cubes;

Figure 1:
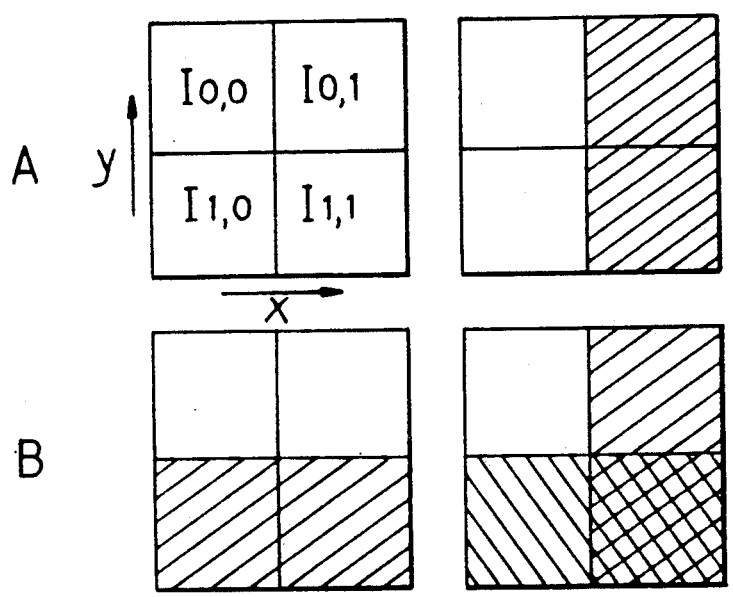

With reference now to the drawings, in order to simplify the problem, it is beneficial to consider a 2×2 matrix representing a simple image, as shown in FIG. 1. The aim is to obtain signals from any of the four squares, by linear combination of the results from a sequence of experiments. The method may then be extended to larger arrays by a process of subdivision of array elements and repetition of the principle of the technique. Let us suppose that we have an image which can be represented by the 2×2 matrix given below $$\tilde{I} = \begin{pmatrix} 3 & 15 \\ 1 & 9 \end{pmatrix} \quad (1)$$

Each element of the matrix $I_{i,j}$ corresponds to the intensity of signal generated in a region of real space. It is useful to adopt a binary notation so that $i=0,1$ and $j=0,1$.

The matrices $$\tilde{M}^{0,0} = \begin{pmatrix} 1 & 1 \\ 1 & 1 \end{pmatrix} \quad \tilde{M}^{0,1} = \begin{pmatrix} 1 & -1 \\ 1 & -1 \end{pmatrix} \quad (2)$$

$$\tilde{M}^{1,0} = \begin{pmatrix} 1 & 1 \\ -1 & -1 \end{pmatrix} \quad \tilde{M}^{1,1} = \begin{pmatrix} 1 & -1 \\ -1 & 1 \end{pmatrix}$$

correspond to the operation of inversion of the NMR spins in that region of real space only when the element is $-1$. A selective 180° pulse is used to achieve this goal, and note that $\tilde{M}^{1,1}$ requires the application of two selective pulses. If the element is $+1$, then the spins are not inverted, or have been inverted twice. The effect of this inversion is represented diagrammatically in FIG. 1, where hatched elements have experienced a single inversion pulse, and cross-hatched elements have received two pulses. Each matrix therefore corresponds to an individual NMR experiment. We denote these matrices by $\tilde{M}^{\alpha,\beta}$, where $\alpha,\beta$ is a label for the matrix and not an index. We also denote $\tilde{M}_{i,j}^{\alpha,\beta}$ to be the i,jth matrix element of matrix $\tilde{M}^{\alpha,\beta}$, where $i,j=0,1$.

The matrix $\tilde{M}^{\alpha,\beta}$ has column $j=1$ with their spins inverted if $\beta=1$, and the spins not inverted if $\beta=0$. Similarly the row $i=1$ is inverted if $\alpha=1$ and not inverted if $\alpha=0$. Thus the matrix $\tilde{M}^{1,1}$ has both row $i=1$ and column $j=1$ inverted, and $\tilde{M}_{1,1}^{1,1}=1$ as the spins have been inverted twice to end up aligned with the field.

Signals $S^{\alpha,\beta}$ are acquired in each experiment given by $$S^{\alpha,\beta} = \sum_i \sum_j \tilde{M}_{i,j}^{\alpha,\beta} \tilde{I}_{ji} \quad (3)$$

These are the result of flipping the spins in rows and columns as defined by the matrices $\tilde{M}^{\alpha,\beta}$ and then measuring the NMR signal. For the image matrix of equation (1), we readily find signals $S^{0,0}=28$, $S^{0,1}=8$, $S^{1,0}=-20$ and $S^{1,1}=-4$.

From these projected signals we can recover the original matrix by the following procedure. Another set of matrices are created $$\tilde{R}^{0,0} = \begin{pmatrix} 1 & 0 \\ 0 & 0 \end{pmatrix} \quad \tilde{R}^{0,1} = \begin{pmatrix} 0 & 1 \\ 0 & 0 \end{pmatrix} \quad (4)$$

$$\tilde{R}^{1,0} = \begin{pmatrix} 0 & 0 \\ 1 & 0 \end{pmatrix} \quad \tilde{R}^{1,1} = \begin{pmatrix} 0 & 0 \\ 0 & 1 \end{pmatrix}$$

which are related to the matrices $\tilde{M}^{\alpha,\beta}$ (as can be seen by working out each example) by the formula $$\tilde{R}^{ij} = \frac{1}{4} \sum_{\alpha=0}^{1} \sum_{\beta=0}^{1} (-1)^{(\alpha i + \beta j)} \tilde{M}^{\alpha,\beta} \quad (5)$$

These matrices simply select the signal from the desired quadrant. The purpose of this procedure is to determine $\tilde{I}_{j,i}$, which is the signal from each quadrant. By evaluating each example the reader can establish that $$\tilde{I}_{ji} = \sum_{\gamma=0}^{1} \sum_{\delta=0}^{1} \tilde{R}_{\gamma\delta}^{ij} \tilde{I}_{\delta\gamma} \quad (6)$$

and hence application of $\tilde{R}^{ij}$ selects the signal from the j,ith cube.

Substitution of equation (5) into (6) gives $$\tilde{I}_{ji} = \frac{1}{4} \sum_{\alpha=0}^{1} \sum_{\beta=0}^{1} (-1)^{(\alpha i + \beta j)} \sum_k \sum_l \tilde{M}_{k,l}^{\alpha,\beta} \tilde{I}_{l,k}$$

$$= \frac{1}{4} \sum_{\alpha=0}^{1} \sum_{\beta=0}^{1} (-1)^{(\alpha i + \beta j)} S^{\alpha,\beta}$$

For our elementary example $\tilde{I}_{0,0} = \frac{1}{4}(S^{0,0}+S^{0,1}+S^{1,0}+S^{1,1})=3$ $\tilde{I}_{0,1} = \frac{1}{4}(S^{0,0}+S^{0,1}-S^{1,0}-S^{1,1})=15$ $\tilde{I}_{1,0} = \frac{1}{4}(S^{0,0}-S^{0,1}+S^{1,0}-S^{1,1})=1$ $\tilde{I}_{1,1} = \frac{1}{4}(S^{0,0}-S^{0,1}-S^{1,0}+S^{1,1})=9$ Therefore, four signal measurements can be combined in linear combinations to determine each of the four signal components in a 2×2 matrix. The extension to three dimensional images is straightforward.

It is more difficult to see how to extend this technique to 4×4 matrices, and then to 8×8 etc. We do this by taking 4×4 matrices as direct products (A. W. Joshi; "Matrices and Tensors in Physics", p. 138, Wiley Eastern Ltd., New Delhi (1975)) of the matrices $\tilde{M}^{\alpha,\beta}$ $$\tilde{M}^{\alpha,\beta} \otimes \tilde{M}^{\gamma,\delta} = \begin{pmatrix} \tilde{M}_{0,0}^{\alpha,\beta} \tilde{M}^{\gamma,\delta} & \tilde{M}_{0,1}^{\alpha,\beta} \tilde{M}^{\gamma,\delta} \\ \tilde{M}_{1,0}^{\alpha,\beta} \tilde{M}^{\gamma,\delta} & \tilde{M}_{1,1}^{\alpha,\beta} \tilde{M}^{\gamma,\delta} \end{pmatrix}$$

For example one of the 16 such 4×4 matrices is $$\tilde{M}^{1,0} \otimes \tilde{M}^{1,1} = \begin{pmatrix} \tilde{M}^{1,1} & \tilde{M}^{1,1} \\ -\tilde{M}^{1,1} & -\tilde{M}^{1,1} \end{pmatrix}$$

$$= \begin{pmatrix} +1 & -1 & +1 & -1 \\ -1 & +1 & -1 & +1 \\ -1 & +1 & -1 & +1 \\ +1 & -1 & +1 & -1 \end{pmatrix}.$$

In order to obtain this sign dependence of the image signal the 2nd and 3rd rows of NMR spins should be inverted, and the 2nd and 4th columns.

Let us label the element of the above matrix by row k, column l, so that this element is $N_{k,l}^{1,0;\,1,1}$. From these 16 4×4 matrices we obtain signals $$S^{\alpha,\beta;\gamma,\delta} = \sum_{k,l} N_{k,l}^{\alpha,\beta;\gamma,\delta} \tilde{I}_{l,k} \quad \text{where } l,k = 0, 1, 2, 3$$

Once again we want to reconstruct the image from these signals. We do this using the same procedure, constructing new matrices $$\tilde{T}^{i,j;i',j'} = \tilde{R}^{ij} \otimes \tilde{R}^{i'j'}$$

$$= \left(\frac{1}{4}\right)^2 \sum_{\alpha=0}^{1} \sum_{\beta=0}^{1} \sum_{\alpha'=0}^{1} \sum_{\beta'=0}^{1} (-1)^{(\alpha i + \beta j)}$$

$$(-1)^{(\alpha' i' + \beta' j')} \tilde{M}^{\alpha,\beta} \otimes \tilde{M}^{\alpha',\beta'}$$

This matrix is non zero only for element l, k where $l = 2i + i'$, and $k = 2j + j'$. In the same way we obtain $$\tilde{I}_{k,l} = \frac{1}{4^2} \sum_{\alpha=0}^{1} \sum_{\beta=0}^{1} \sum_{\alpha'=0}^{1} \sum_{\beta'=0}^{1} (-1)^{(\alpha i + \beta j + \alpha' i' + \beta' j')} S^{\alpha\beta;\alpha'\beta'}$$

The extension to 8×8 is now clear; one constructs a matrix from $\tilde{M}^{\alpha,\beta} \otimes \tilde{M}^{\alpha',\beta'} \otimes \tilde{M}^{\alpha'',\beta''}$ and projects out the signals from them.

This technique provides a means of reconstructing discrete images of an object without using a Fourier transformation. A sequence of selective inversion pulses are used to invert strips of the object along orthogonal directions. Data acquisition consists of measurement of the intensity of the resultant signal. If the NMR measurement experiment consists of a 90° pulse in the absence of field gradients, the chemical spectrum of each volume element can be determined in a similar manner to the ISIS method (R. J. Ordidge, A. Connelly and J. A. B. Lohman; J. Magn. Reson. 66, 283 (1986)).

Figure 2:
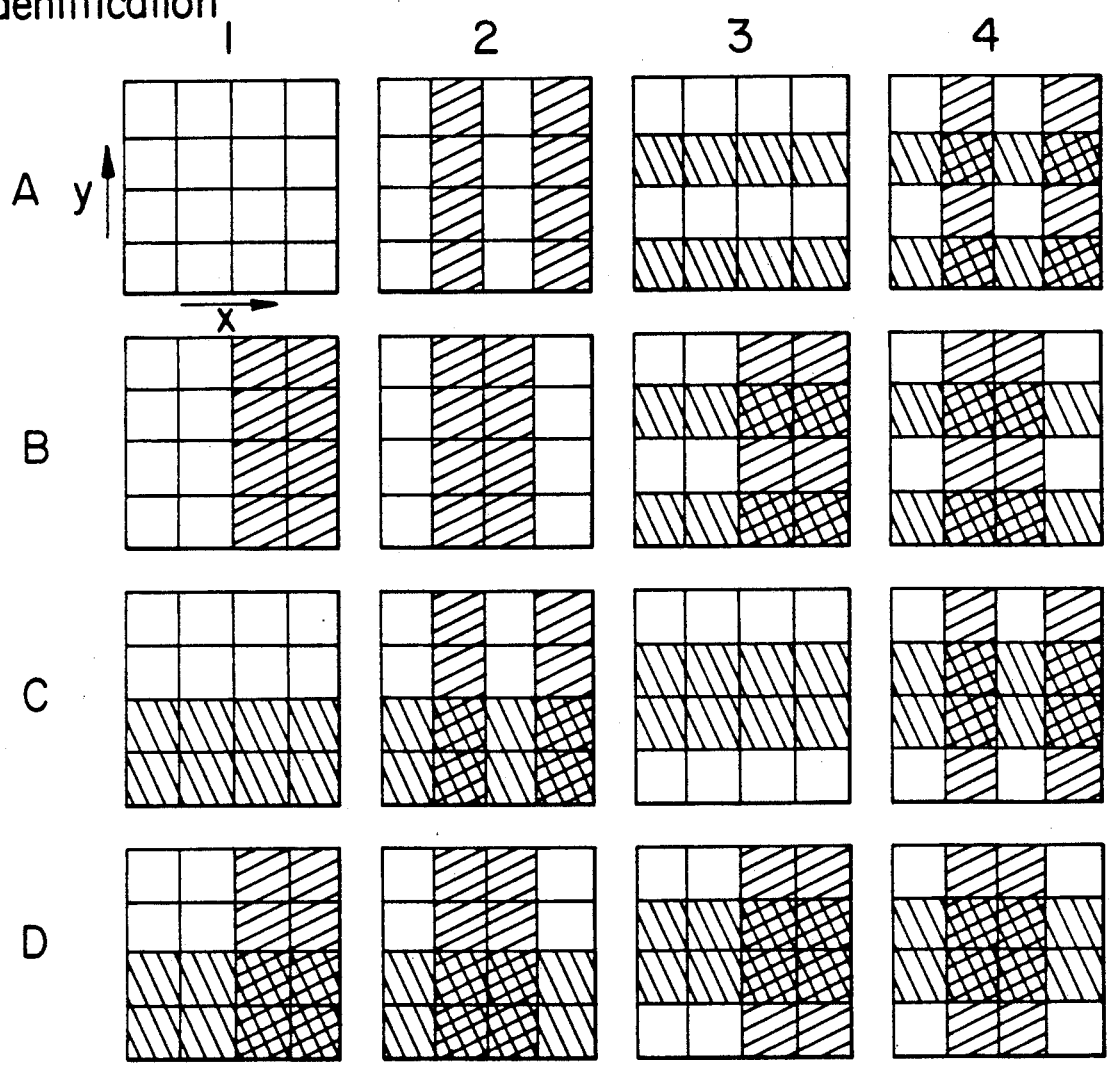

The preferred method requires the application of $N^2$ experiments to determine the chemical spectrum from $N \times N$ matrix of cubic volume elements where $n = 2^p$ and p is an integer. Each experiment requires the application of up to N selective inversion pulses, which eventually imposes a limit to the array size. FIG. 2 shows the spatial distribution of inversions for selection of a 4×4 matrix. Slice selection using the ISIS principle necessitates an extra inversion pulse and a doubling of the number of experiments to $2N^2$.

A disadvantage of this method is that if the image matrix spans the overall dimensions of the object, the extremities of the object should ideally experience a perfect 180° spin nutation at the relevant times in the experimental sequence. Clearly in the practical situation with inhomogeneous RF transmitter coils and extended specimens, this is not possible. A better approach is therefore to remove the signal from the majority of the subject using the standard ISIS technique, and apply the principle described earlier to subdivide the selected large cube into an $N \times N$ matrix of smaller cubes. In two dimensions, a sequence of 4 experiments is required to select the central volume, and this must be multiplied by the number of experiments required to further subdivide the central cube into a 2×2 or 4×4 matrix etc. The outer loop of 4 experiments ensures cancellation of large regions of unwanted signal surrounding the central volumes of interest where experimental errors might have compromised the accuracy of all measurements in the data set, if the normal procedure had been applied to the whole sample.

Figure 3:
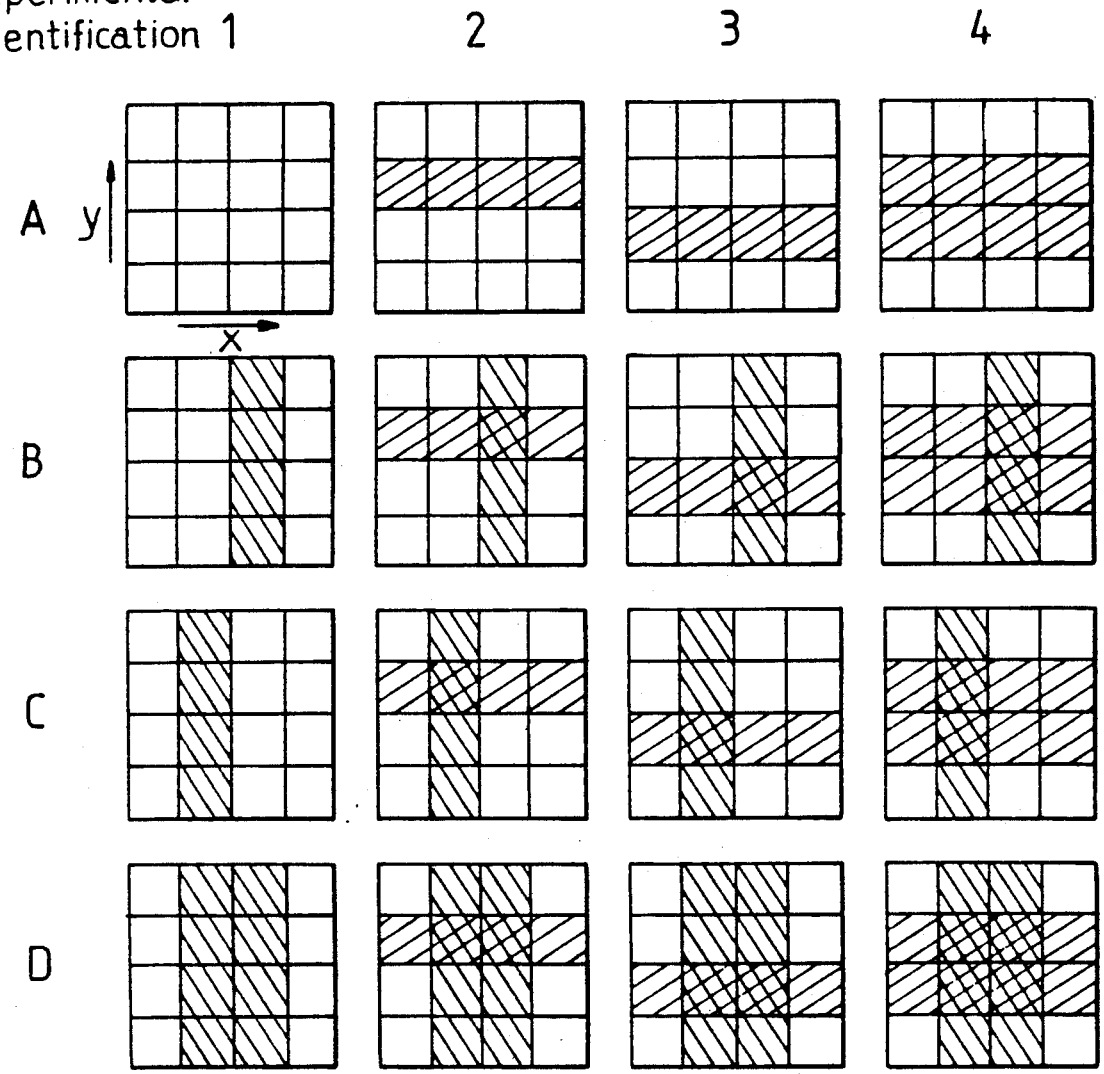
FIG. 3 shows the spatial distribution of spin inversions for a modified sequence that eliminates the signal from all volume elements around the edge of the sample, and enables the signal from each of the four central elements to be individually determined.

FIG. 3 shows a modified sequence of selective inversions based on this principle. In this example the total experimental sequence now consists of 16 experiments, and the purpose is to determine the individual spectra from a 2×2 matrix in the centre of the object whilst eliminating all peripheral volume elements. If slice selection is applied using the ISIS principle along the third axis, the full experimental sequence would require 32 experiments. An advantage of this sequence is that in the determination of the spectra from each of the central four volume elements, the signal from all other cubes cancels perfectly. Elaborating on this point, the same volume of material experiences an even number of inversions and double inversions during the sequence. Since experimental errors might occur, we can assume that double inversion is not equivalent to leaving the NMR spins unperturbed. The linear combination for perfect cancellation of these signals must therefore result in cancellation of like signals. Another property of this combination procedure, is that the signal from each cube should always add without cancellation, whilst all other signals should be completely destroyed. The resultant signal to noise ratio is therefore equivalent to that obtainable by isolating the volume element in some other way (e.g. surgically), and performing an equal number of straightforward 90° pulse-acquire NMR experiments.

Figure 5:
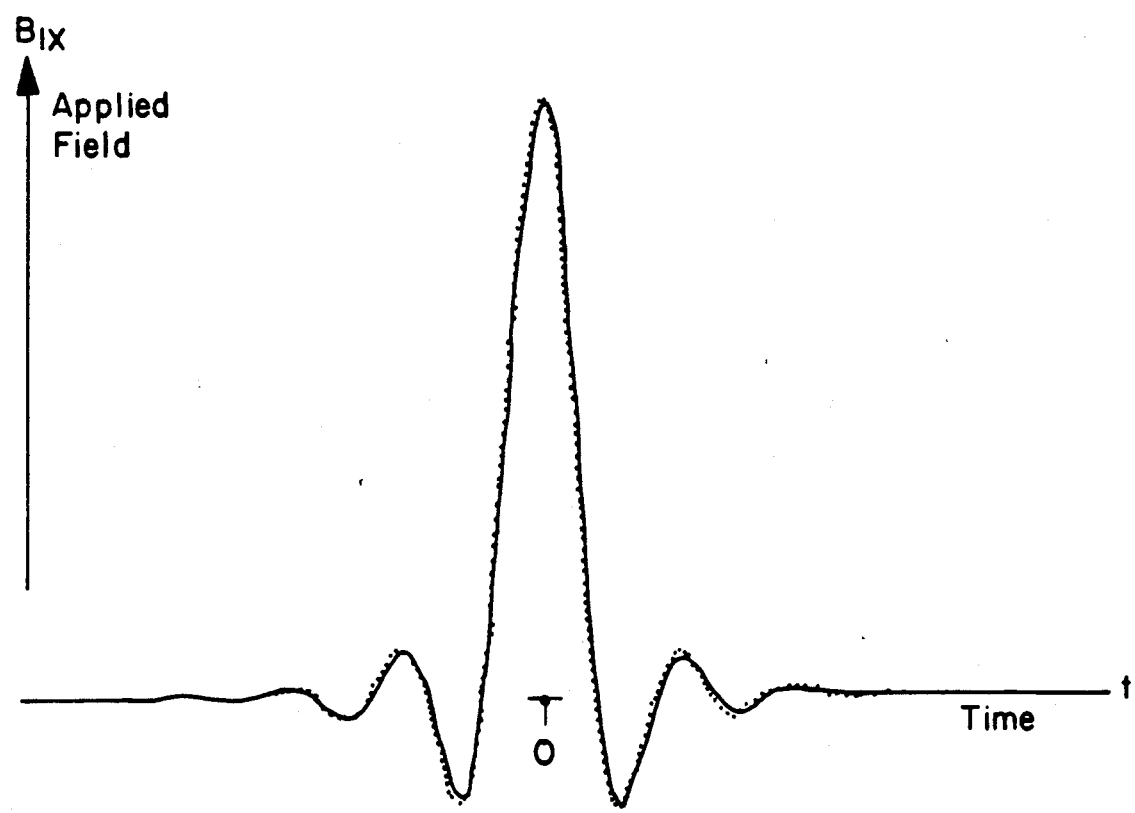
FIG. 5 shows an exemplary RF pulse.

Extension of this principle to determine the individual spectra from $N \times N$ cubes and including slice selection, requires a sequence of $8N^2$ experiments with up to $2N + 1$ selective inversion pulses per experiment. For example, with 8×8 cubes, we require 512 experiments and up to 17 selective inversion pulses. If the RF pulse (proposed by M. S. Silver, R. I. Joseph and D. I. Hoult; J. Magn. Reson. 59, 349 (1984)) and shown in FIG. 5 is used for selective inversion, a practical pulse length is typically 20 milliseconds. Seventeen selective pulses would therefore probably result in an unacceptable weighting of the acquired spectra through the effects of spin lattice relaxation.

Figure 4A:
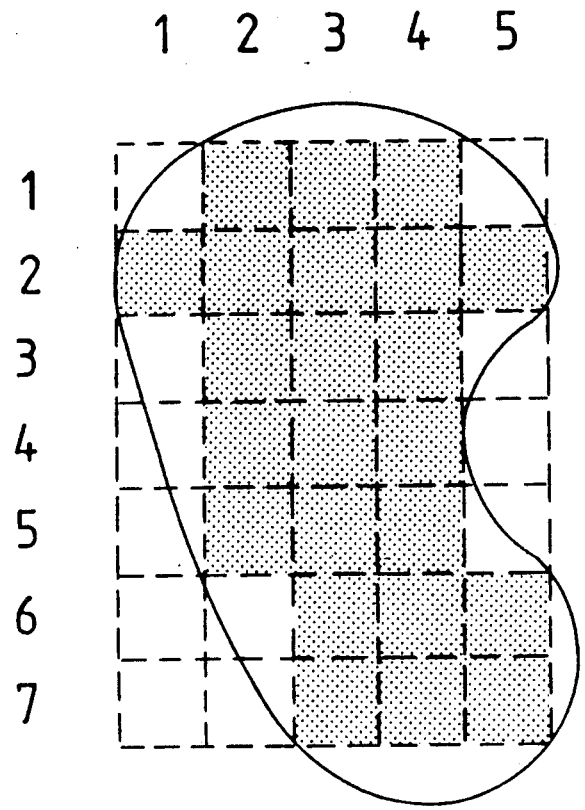
FIG. 4(A) shows an irregular volume (solid line) subdivided into a 7×5 matrix of cubes. In order to prevent the detection of signal from volumes outside the region of interest, only the signal from the shaded cubes are useful in a spatially localized NMR experiment.
Figure 4B:
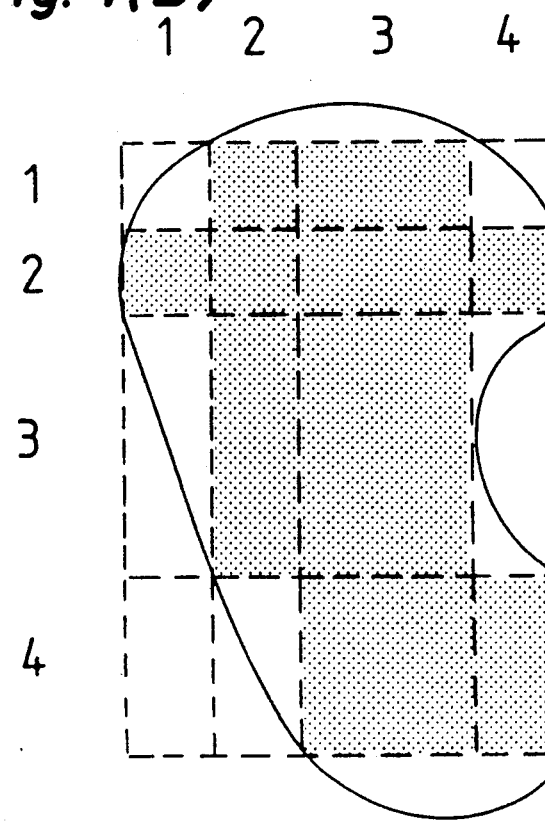
FIG. 4(B) shows exactly the same spatial distribution of useful signal may be measured in an ISIS experiment consisting of 4×4 rectangular volume elements of varying size. A saving in experimental time may thus be achieved.

There are, however, two main advantages of this general approach. Firstly, each volume element need not be cubic, and the technique allows for different size elements within a single sequence. If the signal from adjacent cubes is added together, this enables an irregular selective volume to be more easily covered by a mosaic of different size rectangular volumes, provided they fit within a non-uniform grid. This is illustrated in FIG. 4. FIG. 4(A) shows an irregular-shaped volume which can be adequately represented by a 7×5 matrix of cubes. FIG. 4(B) shows the same shaped volume covered with exactly the same efficiency using a 4×4 matrix of rectangular volume elements of varying size. A corresponding reduction in the number of ISIS volume elements would result in a reduction of the minimum number of ISIS experiments required to investigate this sample volume. Secondly the elements need not be adjacent in space, and may be separated to investigate different body organs within a single experiment.

It may be more efficient to produce certain shaped volumes by subtraction of different size rectangular volumes rather than by extension of the matrix size. The general principle of reconstructing spectra using addition and subtraction of signals with different inversions and double inversions can be extended up to an image matrix of dimensions $2^p \times 2^q$ where p and q are integers.

The present invention provides a theoretical basis for the extension of the ISIS technique to multiply defined volumes. These are useful for the investigation of irregular tissue volumes because the signal from a series of volume elements can be subsequently coadded. Alternatively, several volume elements positioned in different regions of the subject can be simultaneously investigated with a corresponding increase in efficiency and utility of the NMR spectrometer. The practical limitation is the number of selective inversion pulses which may be applied in quick succession. The total duration should be less than one tenth of the spin lattice relaxation time to minimize distortion of the measured in-vivo spectrum through spin-lattice relaxation during the pre-pulse period. Therefore a practical approach might be to use an array of 4×4 volume elements requiring 128 experiments with up to 9 selective inversion pulses. This will probably cover regions of the specimen with the equivalent spatial definition of a much larger array obtainable by chemical shift imaging. Furthermore if a selective 90° pulse is used in ISIS for signal acquisition combined with slice definition, in a similar manner to the chemical shift imaging experiment, the number of experiments is immediately reduced by a factor of two. Finally, we would like to point out that system instability and dynamic range limitations can cause as many problems in chemical shift imaging experiments as in ISIS. However, the option to selectively randomise unwanted signal using a noise pulse (R. J. Ordidge; Magn. Reson. Med. 5, 93 (1987)) is available in both experiments.

I claim:

1. A method of generating an NMR spectrum of a desired portion of an object including obtaining M NMR responses of the object, each response comprising information from a plurality of smaller volumes within said object and combining together the M NMR responses by addition to obtain responses from selected smaller volumes, in which in the total sequence of M NMR responses each small volume experiences an even number of inversions of the spin system.

2. A method of generating an NMR spectrum of a desired portion of an object including obtaining M NMR responses of the object, each response comprising information from a plurality of smaller volumes within said object and combining together the M NMR responses by addition to obtain responses from selected smaller volumes, in which in the total sequence of M NMR responses each small volume experiences an even number of double inversions of the spin system.

3. A method of generating an NMR spectrum of a desired portion of an object including obtaining M NMR responses of the object, each response comprising information from a plurality of smaller volumes within said object and combining together the M NMR responses by subtraction to obtain responses from selected smaller volumes, in which in the total sequence of M NMR responses each small volume experiences an even number of inversions of the spin system.

4. A method of generating an NMR spectrum of a desired portion of an object including obtaining M NMR responses of the object, each response comprising information from a plurality of smaller volumes within information from a plurality of smaller volumes within said object and combining together the M NMR responses by subtraction to obtain responses from selected smaller volumes in which in the total sequence of M NMR responses each small volume experiences an even number of double inversions of the spin system.

* * * * *